US009869734B2

(12) United States Patent
Mathieu et al.

(10) Patent No.: US 9,869,734 B2
(45) Date of Patent: Jan. 16, 2018

(54) SYSTEM AND METHOD FOR MANUFACTURING MAGNETIC RESONANCE IMAGING GRADIENT COIL ASSEMBLIES

(71) Applicant: General Electric Company, Schenectady, NY (US)

(72) Inventors: Jean-Baptiste Mathieu, Niskayuna, NY (US); Saban Kurucay, Menomonee Falls, WI (US); Thomas Kwok-Fah Foo, Clifton Park, NY (US); Yanzhe Yang, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 670 days.

(21) Appl. No.: 13/859,586

(22) Filed: Apr. 9, 2013

(65) Prior Publication Data
US 2014/0302258 A1   Oct. 9, 2014

(51) Int. Cl.
*G01R 33/385* (2006.01)
*H01F 41/04* (2006.01)

(52) U.S. Cl.
CPC ......... *G01R 33/3858* (2013.01); *H01F 41/04* (2013.01); *G01R 33/3856* (2013.01)

(58) Field of Classification Search
CPC .............................. G01R 33/3858; H01F 41/04
See application file for complete search history.

(56) References Cited

U.S. PATENT DOCUMENTS

| 5,730,925 | A | * | 3/1998 | Mattes | ................. B22F 3/1055 |
| | | | | | 219/121.73 |
| 6,057,680 | A | | 5/2000 | Foo et al. | |
| 6,167,293 | A | | 12/2000 | Chenevert et al. | |
| 6,294,913 | B1 | | 9/2001 | Hinks et al. | |
| 6,311,389 | B1 | * | 11/2001 | Uosaki | ............... G01R 33/3858 |
| | | | | | 29/605 |
| 6,483,308 | B1 | | 11/2002 | Ma et al. | |
| 7,280,862 | B2 | | 10/2007 | Gupta et al. | |
| 7,382,131 | B2 | | 6/2008 | Eberler et al. | |
| 7,488,946 | B2 | | 2/2009 | Hennessy et al. | |
| 7,548,064 | B1 | | 6/2009 | Wang et al. | |

(Continued)

OTHER PUBLICATIONS

U.S. Appl. No. 13/730,419, filed Dec. 28, 2012, Jean-Baptiste Mathieu.

(Continued)

*Primary Examiner* — Dah-Wei D Yuan
*Assistant Examiner* — Stephen Kitt
(74) *Attorney, Agent, or Firm* — Pabitra K. Chakrabarti (57) ABSTRACT

The embodiments disclosed herein relate generally to magnetic resonance imaging systems and, more specifically, to the manufacturing of a gradient coil assembly for magnetic resonance imaging (MRI) systems. For example, in one embodiment, a method of manufacturing a gradient coil assembly for a magnetic resonance imaging system includes depositing a first layer comprising a base material onto a surface to form a substrate and depositing a second layer onto the first layer. The second layer may enable bonding between a conductor material and the substrate. The method also includes depositing a third layer onto the second layer using a consolidation process. The consolidation process uses the conductor material to form at least a portion of a gradient coil.

9 Claims, 7 Drawing Sheets

(56) References Cited

U.S. PATENT DOCUMENTS

| | | | |
|---|---|---|---|
| 7,812,604 | B2 | 10/2010 | Icoz et al. |
| 8,169,220 | B2 | 5/2012 | Hollis et al. |
| 8,207,736 | B2 | 6/2012 | Chu et al. |
| 8,311,641 | B2 | 11/2012 | Zhu et al. |
| 8,326,010 | B2 | 12/2012 | Hofstetter et al. |
| 8,362,776 | B2 | 1/2013 | Chu et al. |
| 2004/0094728 | A1* | 5/2004 | Herzog ............... B22F 3/1055 250/559.06 |
| 2004/0210128 | A1 | 10/2004 | Martel et al. |
| 2007/0040702 | A1 | 2/2007 | Mosher et al. |
| 2007/0216411 | A1* | 9/2007 | Eberler ............. G01R 33/3858 324/318 |
| 2010/0168553 | A1 | 7/2010 | Martel et al. |
| 2012/0092105 | A1 | 4/2012 | Weinberg et al. |
| 2012/0132644 | A1 | 5/2012 | Gu et al. |
| 2012/0146643 | A1 | 6/2012 | Saha et al. |
| 2012/0317795 | A1* | 12/2012 | Fath ................... G01R 33/3858 29/605 |

OTHER PUBLICATIONS

Urdaneta, Mario G., et al; "Goodbye Wires and Formers: 3-D Additive Manufacturing and Fractal Cooling Applied to Construction of MRI Gradient Coils"; IEEE Nuclear Science Symposium and Medical Imaging Conference (NSS/MIC), Oct. 23-29, 2011, 2479-2482.

Hernandez, Ludwing, et al.; "Integration & Process Planning for Combined Ultrasonic Consolidation and Direct Write", Utah State University, Sep. 18, 2009, 19 pages.

Johnson, Denton H.; "Uniform Temperature Infrared Targets Using Ultrasonic Consolidation", Utah State University, 2007, 119 pages.

Lane, Brian; "Ultrasonic Additive Manufacturing Puts Together a Metal Mold", Industry Market Trends Machining Journal, Jun. 8, 2012, 2 pages.

Boivie, Klas; "Enhanced Tooling by Additive Manufacturing Technology", SINTEF Product and Production, accessed Mar. 28, 2013, 1 page.

Winker, Rob; "MRI Scanners: Design & Manufacturing with FDM", Stratasys, Inc, 2011, 2 pages.

Symes, Mark D., et al., "Intergrated 3D-printed reactionware for chemical synthesis and analysis", Nature Chemistry 4, 349-354, Apr. 15, 2012.

Johnson, R. Daniel; "Custom labware: Chemical creativity with 3D printing", Nature Chemistry 4, 338-339, Apr. 15, 2012.

Additive Manufacturing Users Group (AMUG), http://additivemanufacturingusersgroup.com/about.htm, accessed Mar. 28, 2013, 3 pages.

Therriault, D., et al.; "Fugitive Inks for Direct-Write Assembly of Three-Dimensional Microvascular Networks", Feb. 18, 2005, Advanced Materials vol. 17, Issue 4, 395-399.

* cited by examiner

SYSTEM AND METHOD FOR MANUFACTURING MAGNETIC RESONANCE IMAGING GRADIENT COIL ASSEMBLIES

BACKGROUND

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Magnetic Resonance Imaging (MRI) systems enable imaging based on a primary magnetic field, a radio frequency (RF) pulse, and time-varying magnetic gradient fields that interact with specific nuclear components in an object, such as hydrogen nuclei in water molecules. The magnetic moments of such nuclei may generally align with the primary magnetic field, but subsequently precess about the bulk magnetic field direction at a characteristic frequency known as the Larmor frequency. An RF pulse at or near the Larmor frequency of such nuclei may cause their magnetic moments to be rotated. When the RF pulse has ended, the magnetic moments relax and generally align with the primary magnetic field, emitting a detectable signal.

Some of the magnetic gradient fields in MRI are produced by a series of gradient coils. In particular, the gradient coils create magnetic fields of varying strength along various imaging planes to produce a gradient along each plane. Nuclei of interest (e.g., hydrogen) align their spins according to the gradients. This results in spatial encoding, where spatial information about the location of the excited hydrogen nuclei can be obtained during acquisitions. Strong amplifiers power the gradient coils, allowing them to rapidly and precisely adjust the magnetic field gradients.

Generally, gradient coils for conventional cylindrical whole body magnetic resonance imaging (MRI) systems are manufactured by laying machined or wound electrical conductor material that has been rolled into a cylindrical shape onto a cylindrical former. Planar and other non-right circular cylindrical geometries for the gradient coils are also used for MRI. The teachings in this application herein do not preclude its use in non-right circular cylindrical geometries and are in fact applicable to other geometries. Moreover, various other layers including spacers, dielectric insulators, cooling features, passive shim bars, resistive shim assemblies, and RF shield are laid onto the cylindrical former to complete a gradient coil assembly. The performance of the gradient coils is dependent, at least in part, on the precise alignment of the layers before being fixed or bound to the cylindrical former. In addition, the manner in which the gradient coils are formed may affect their durability. For example, the durability of the gradient coils may decrease due to stress resulting from winding or otherwise bending the coils to a desired shape. Furthermore, additional gradient coil features (e.g. soldering pads, connecting leads, jumpers and barbs) are brazed onto the MRI gradient boards, which can introduce weak points into the coil assembly. Unfortunately, many of the above processes may be performed by hand, which can introduce manufacturer error and uncertainty into the overall manufacturing process.

BRIEF DESCRIPTION

In one embodiment, a method of manufacturing a gradient coil assembly for a magnetic resonance imaging system includes depositing a first layer including a base material onto a surface to form a substrate and depositing a second layer onto the first layer. The second layer may enable bonding between a conductor material and the substrate. The method also includes depositing a third layer onto the second layer using a consolidation process. The consolidation process uses the conductor material to form at least a portion of a gradient coil.

In another embodiment, a system, includes an additive manufacturing system including a plurality of configurable elements that may deposit a plurality of materials to form a gradient coil assembly, a platform including a mandrel that may support the plurality of materials as they are deposited, a control system communicatively coupled to the additive manufacturing system, the platform, or a combination thereof. The control system may control the additive manufacturing system, the platform, or the combination thereof, such that the system produces an inductor having one or more internal fluid paths, and a quality inspection module that may provide feedback to the control system. The feedback includes information about the inductor.

In a further embodiment, a system includes a controller that may operate an additive manufacturing system to produce an inductor and an inline quality inspection module communicatively coupled to the controller. The inline quality inspection module may inspect the inductor and provide feedback relating to one or more inductor parameters to the controller. The controller may receive the one or more inductor parameters and adjust an operational parameter of the additive manufacturing system based on the received one or more inductor parameters.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Furthermore, any numerical examples in the following discussion are intended to be non-limiting, and thus additional numerical values, ranges, and percentages are within the scope of the disclosed embodiments.

As noted above, certain processes used to manufacture gradient coil assemblies can be costly, can introduce structural weaknesses into the assemblies, and may result in certain manufacturing defects. Accordingly, it may be desirable to manufacture gradient coil assemblies automatically and in a manner that results in less susceptibility to manufacturing defects and structural instabilities. The present disclosure provides embodiments directed toward manufacturing gradient coil assemblies using one or more additive manufacturing techniques.

For example, the present disclosure provides embodiments for manufacturing gradient coils using electron beam deposition, laser powder deposition, or ultrasonic consolidation. One or more additional additive manufacturing techniques may be used to combine the gradient coils with other gradient coil assembly features, such as spacers, windings, dielectric insulators, and so on. Indeed, in one embodiment, a gradient assembly may be automatically built using an automated gradient coil assembly manufacturing system, which may result in reduced manufacturing time while enhancing manufacturing precision, process control, and reliability compared to more traditional manufacturing approaches, such as manual winding and assembly.

Again, the gradient coil assemblies disclosed herein may be utilized in any magnetic resonance system, such as those commonly used in medical imaging. Turning now to the drawings, and referring first to FIG. 1, an embodiment of such an MRI system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner having a table 20 positioned to place a patient 22 in a desired position for scanning.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field. A series of gradient coils 26, 28 and 30 are grouped in one or more gradient coil assemblies for generating controlled magnetic gradient fields during examination sequences. An RF coil 32 is provided for generating RF pulses for exciting the gyromagnetic material. Power may be supplied to the scanner 12 in any appropriate manner, as indicated generally at reference numeral 34. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils 36 may be provided separate from RF coil 32. Such coils may include structures specifically adapted for target anatomies, such as head coil assemblies. Moreover, receiving coils may be provided in any suitable physical configuration, including phased array coils.

Figure 1:
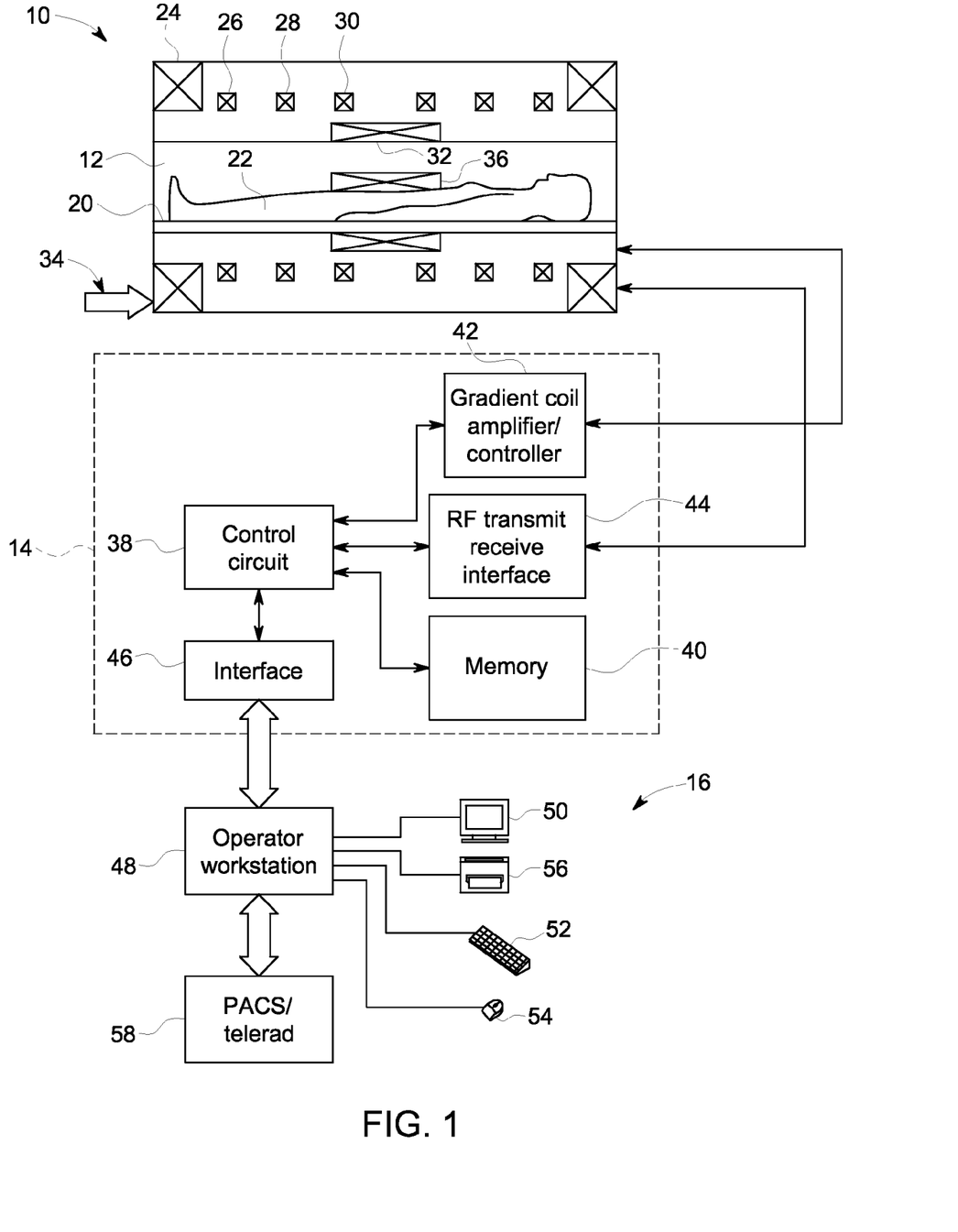
FIG. 1 is a diagram of an embodiment of a MRI system utilizing one or more gradient coils.

In accordance with an embodiment, the gradient coils 26, 28, and 30 may each be formed using conductive wires, bars, plates or sheets to form a coil structure, which generates a gradient field upon application of control pulses. The placement of the gradient coils 26, 28, and 30 within the gradient coil assembly may be done in several different orders and with varying configurations, and the scanner 12 may further include complementary gradient coils to shield the gradient coils 26, 28, and 30. In some embodiments, the gradient coil 26 may be a z-gradient positioned at an outermost location compared to the gradient coils 28 and 30. The gradient coils 28 and 30 may be x-axis and y-axis coils, respectively.

The gradient coils 26, 28, and 30 of the scanner 12 may be controlled by external circuitry to generate desired fields and pulses, and to read signals from the gyromagnetic material in a controlled manner. The gradient coils 26, 28, and 30 may also serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogenous in the other two. The three gradient coils 26, 28, and 30 may have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and/or phase encoding. These functions can be applied along the x-, y- and z-axes of the original coordinate system or along other axes determined by combinations of pulsed currents applied to the individual field coils.

The coils of the scanner 12 are controlled by the scanner control circuitry 14 to generate the desired magnetic field and radiofrequency pulses. In the embodiment of FIG. 1, the control circuitry 14 thus includes a control circuit 38 for commanding the pulse sequences employed during the examinations, and for processing received signals. The control circuit 38 may include any suitable programmable logic device, such as a CPU or digital signal processor of a general purpose or application-specific computer. Further, the control circuit 38 may include memory circuitry 40, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 38 and the coils of the scanner 12 may be managed by amplification and control circuitry 42 and by transmission and receive interface circuitry 44. The amplification and control circuitry 42 includes amplifiers for each gradient field coil 26, 28, and 30 to supply drive current in response to control signals from the control circuit 38. The receive interface circuitry 44 includes additional amplification circuitry for driving the RF coil 32. Moreover, where the RF coil 32 serves both to emit the RF excitation pulses and to receive MR signals, the receive interface circuitry 44 may include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 includes interface components 46 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 48 is provided in the form of a computer workstation employing a general purpose or application-specific computer. The operator workstation 48 also typically includes memory circuitry for storing examination pulse sequence descriptions, examination protocols, user and patient data, image data, both raw and processed, and so forth. The operator workstation 48 may further include various interface and peripheral drivers for receiving and exchanging data with local and remote devices. In the illustrated embodiment, such devices include a monitor 50, a conventional computer keyboard 52, and an alternative input device such as a mouse 54. A printer 56 is provided for generating hard copy output of documents and images reconstructed from the acquired data. In addition, the system 10 may include various local and remote image access and examination control devices, represented generally by reference numeral 58 in FIG. 1. Such devices may include picture archiving and communication systems, teleradiology systems, and the like.

Figure 2:
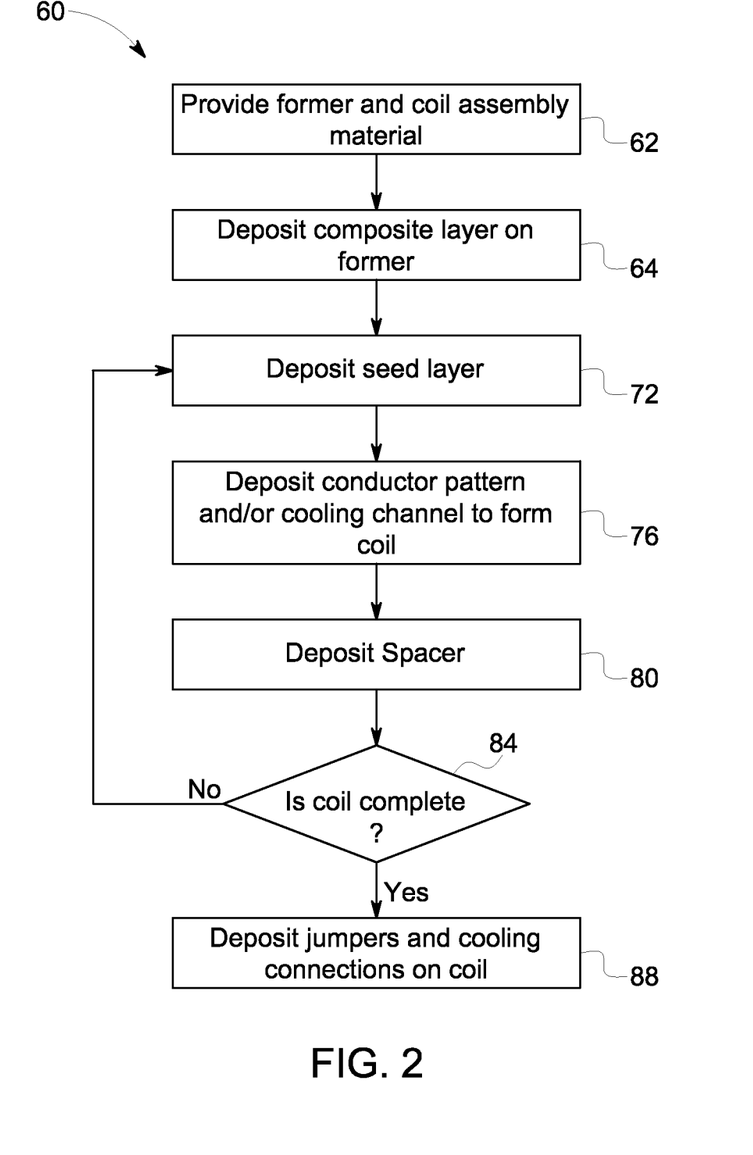
FIG. 2 is a process-flow diagram of an embodiment of a method for manufacturing MRI gradient coil assemblies having cooling channels.

As noted above, the present disclosure provides, among other things, techniques that may be used to construct gradient coil assemblies, such as a gradient coil assembly including gradient coils 26, 28, and 30, in a manner that enables the gradient coil assemblies to be built in an automated system. The automated system may construct the gradient coil assemblies layer by layer, while also constructing the coils in a wide variety of geometries. One such approach is depicted in FIG. 2, which illustrates an embodiment of a method 60 to construct the gradient coil assembly having coils 26, 28, and 30 used in the MRI system 10 of FIG. 1. In addition, to facilitate discussion of aspects of the method 60, reference is made to corresponding structures resulting from the acts of the method 60 in FIGS. 3-9. It should be noted that the method 60 may be performed automatically, such as by an automated system as described in detail with respect to FIG. 10, by a user, or both. Indeed, any one or a combination of the method steps described herein may be performed by such a system, which may include one or more tangible, non-transitory, machine-readable media storing one or more sets of instructions, and one or more processing devices configured to execute the one or more sets of instructions, where the one or more sets of instructions, when executed, perform the automated steps described herein.

The method 60 includes providing a former, a substrate material, which may include a fiberglass reinforced polymer or any other non-conductive durable materials suitable for supporting and/or housing a gradient coil assembly, and a conductor (e.g., coil) material, such as aluminum, copper, their respective alloys, or any other suitable conductive material that may be used to form a gradient coil (block 62). The method 60 also includes depositing the substrate material on the former/mandrel (block 64) to produce a base layer to form a flat or cylindrical gradient coil board.

Figure 3:
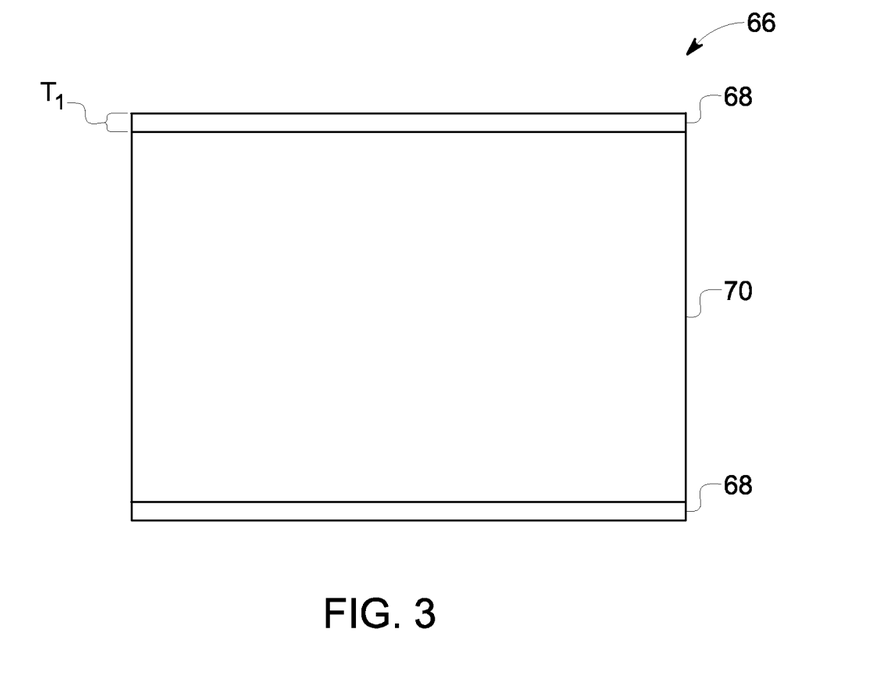
FIG. 3 is a cross-sectional view of an embodiment of a gradient coil assembly resulting from steps of the method of FIG. 2.

One embodiment of a structure resulting from the acts of block 64 is decpited in FIG. 3. In particular, FIG. 3 illustrates a cross-sectional view of an embodiment of a gradient board 66 having a base layer 68 (e.g., a substrate layer) deposited onto a mandrel 70 and having a desired thickness $T_1$. As discussed above, the composite or base material may include fiber reinforced polymers such as, but not limited to, epoxy, vinylester, and polyester thermosets, phenyl formaldehyde resins, polyurethanes, furans, polyimides, or any other suitable polymer having fibers including, but not limited to, glass, aramid, carbon, boron, or any combination thereof. It should be appreciated that the fibers may be impregnated, pre-impregnated, or post impregnated with the desired polymer and/or resin. Any suitable composite winding process (e.g., filament winding) may be used to deposit the composite material onto the mandrel 70 to yield the gradient coil board 66. The fibers in each of the layers of former material in the base layer 68 may be oriented in the same direction or may be oriented in different directions. That is, each layer may have a fiber orientation different from the previous layer. The base layer 68 may be cured using physical or chemical processes known to those skilled in the art once the desired thickness $T_1$ has been achieved. In one embodiment, the base layer 68 may be cured (e.g., in an oven) after deposition of each layer of base material in the base layer 68. In other embodiments the base layer 68 may be cured after several layers of base material have been deposited in the base layer 68. For example, the base layer 68 may be cured after 10%, 25%, 75%, and/or 100% of the thickness $T_1$ has been achieved. In other embodiments, the base layer 68 may be cured after completion of the gradient board assembly.

Figure 4:
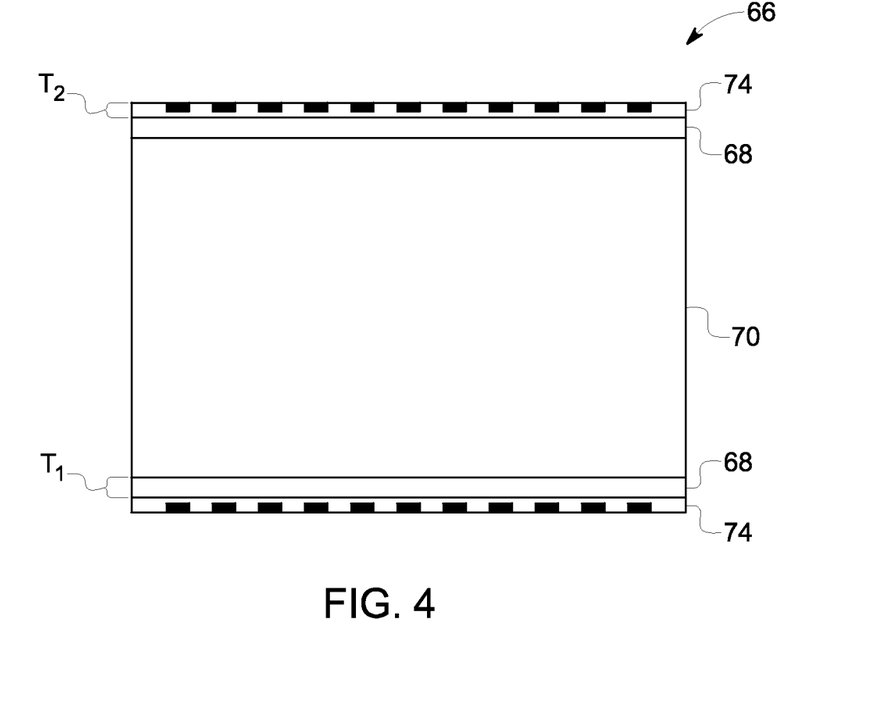
FIG. 4 is a cross-sectional view of an embodiment of a gradient coil assembly having a bonding layer deposited according to the method of FIG. 2.

Returning to the method 60 in FIG. 2, following deposition of the base layer 68, a conductive bonding layer is deposited onto the base layer 68 (block 72). In accordance with block 72, as depicted in FIG. 4, a bonding layer 74 is deposited onto the base layer 68 of the gradient board 66. The bonding layer 74 may include a radio frequency (RF) shield material such as, but not limited to, copper, nickel, aluminum, and their alloys, metal clad materials, metal inks or a combination thereof. Furthermore, the bonding layer may have a thickness $T_2$ that may be similar or different than the thickness $T_1$ of the base layer 68 and may be of any design. For example, the bonding layer 74 design may include a conductive mesh and/or sheet, such that high frequency RF signals can be contained within its boundaries. In other words, in one embodiment, the bonding layer 74 may be a Faraday shield. Deposition of the bonding layer 74 may be performed by a cold spraying process (e.g., gas dynamic cold spray) however, any other suitable spray process may be utilized. After deposition of the bonding layer 74, an additional layer of the base material may be deposited to seal the bonding layer 74 and fill in any voids resulting from the particular bonding layer design.

Figure 5:
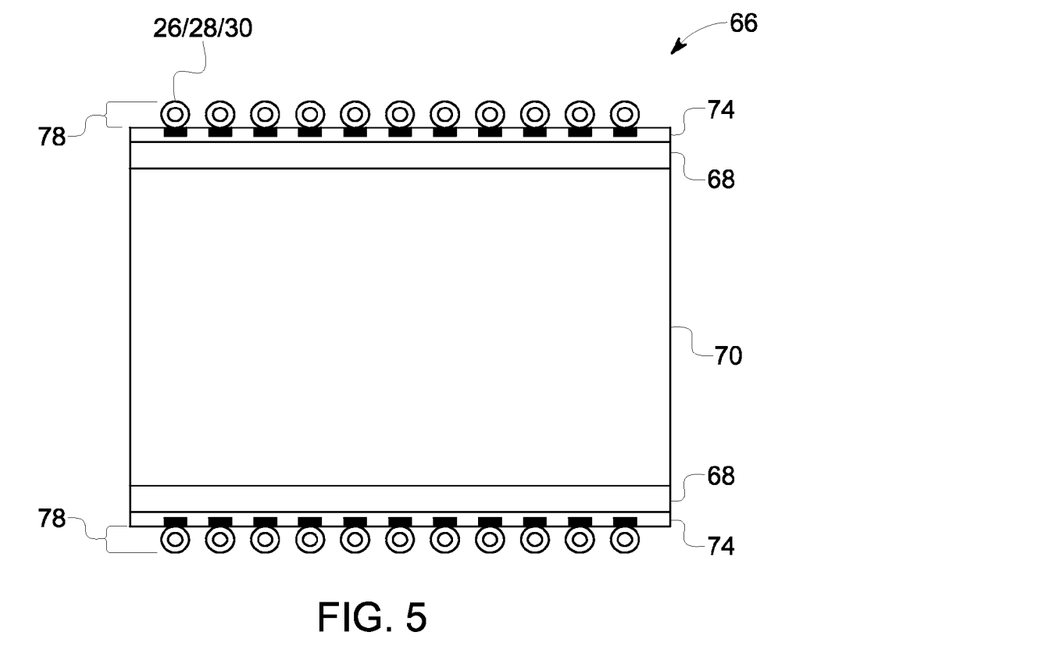
FIG. 5 is a cross-sectional view of an embodiment of a gradient coil board having MRI gradient coils with cooling channels deposited according to the method of FIG. 2.
Figure 6:
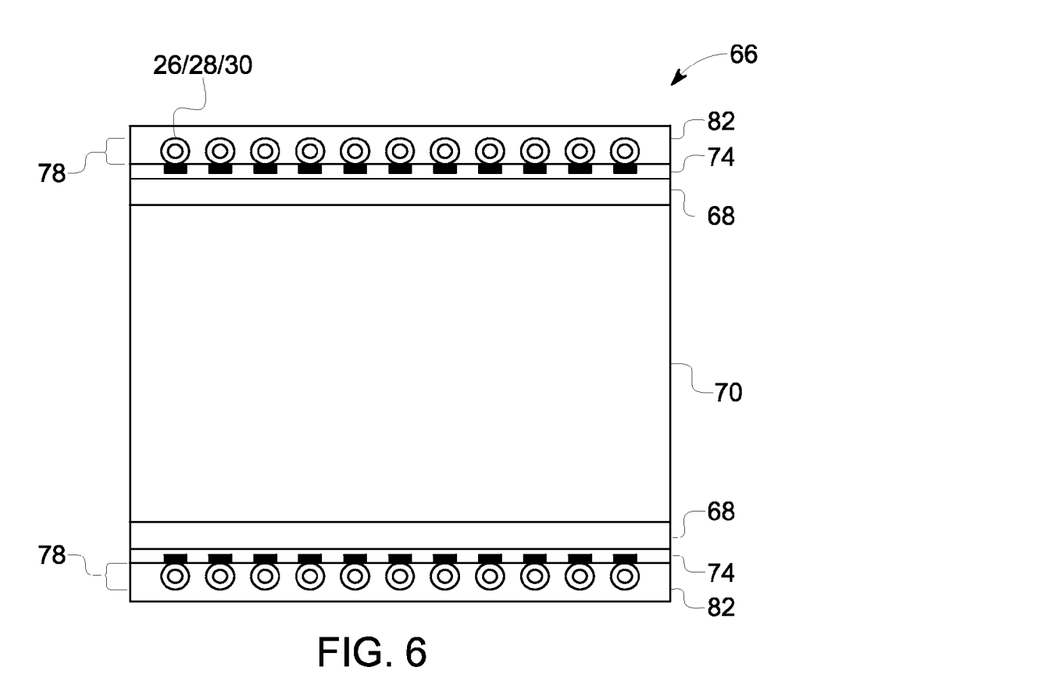
FIG. 6; is a cross-sectional view of an embodiment of an MRI gradient coil board having a spacer deposited according to the method of FIG. 2.
Figure 7:
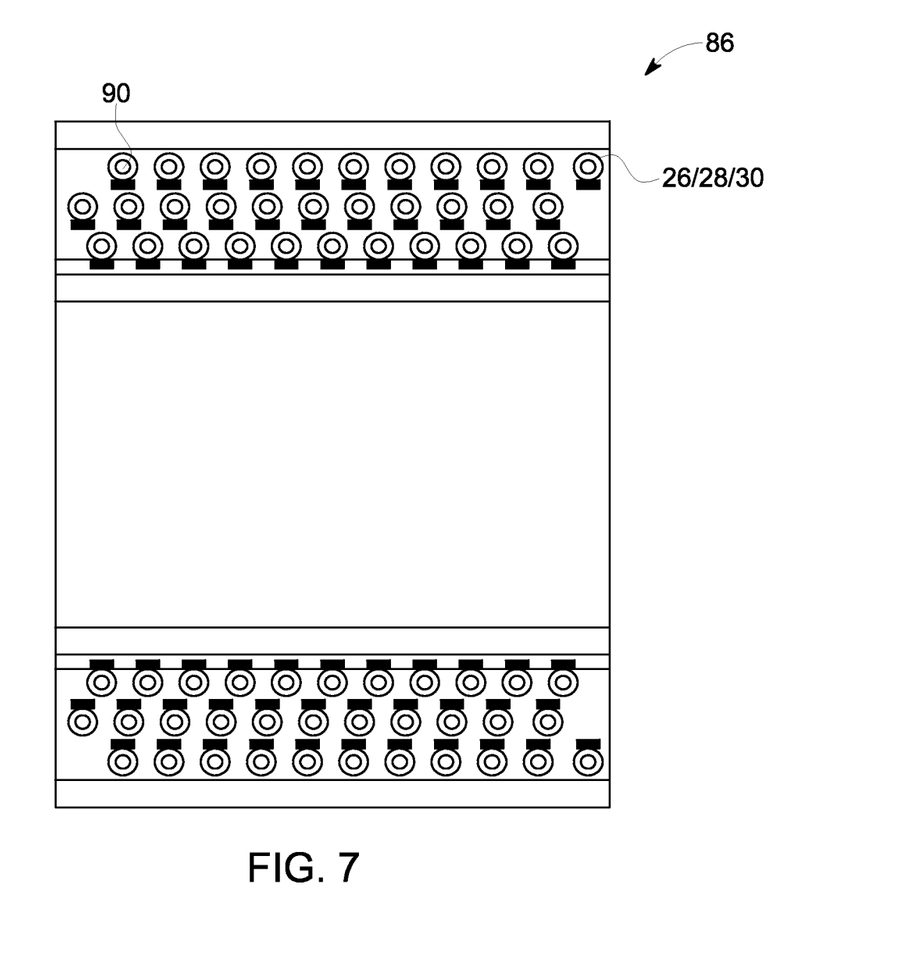
FIG. 7 is a cross-sectional view of an MRI gradient coil board resulting from various steps of the method of FIG. 2.

Turning once again to the method 60 in FIG. 2, following deposition of the bonding layer 74, conductor and cooling channel patterns are deposited (block 76) to form gradient coil geometries (e.g., gradient coils 26, 28, 30 of FIG. 1) and/or resistive shim coil geometries on the gradient board 66. FIG. 5 is a cross-sectional view of an embodiment of the gradient board 66 on the mandrel 70 having the base layer 68, the bonding layer 74, and a gradient coil (or resistive shim coil) layer 78 resulting from the performance of the acts of block 76. It should be noted that to facilitate discussion, certain embodiments described herein are presented in the context of including gradient coils (e.g., within the gradient coil layer 78). However, it should also be noted that any one or a combination of the gradient coil layers (e.g., layer 78) disclosed herein may, additionally or alternatively, include one or more resistive shim coils. Accordingly, while gradient coils may be specifically referenced below, the incorporation of resistive shim coils is also presently contemplated.

The conductor material used to produce the gradient or resistive shim coils may be deposited using various metal deposition methods such as, but not limited to, ultrasonic consolidation, laser sintering, laser cladding, conductive ink printing, and/or electron beam welding to form the gradient (or resistive shim) coils 26, 28, and 30. In one embodiment, the gradient coil layer 78 is deposited using ultrasonic consolidation, as discussed below with respect to FIGS. 8 and 9. Further, the same deposition method can be used to connect the different sections of the cooling or electrical conductor pattern and provide leads, jumpers, and coolant fittings before, during, or after forming the gradient coil geometries.

Figure 8:
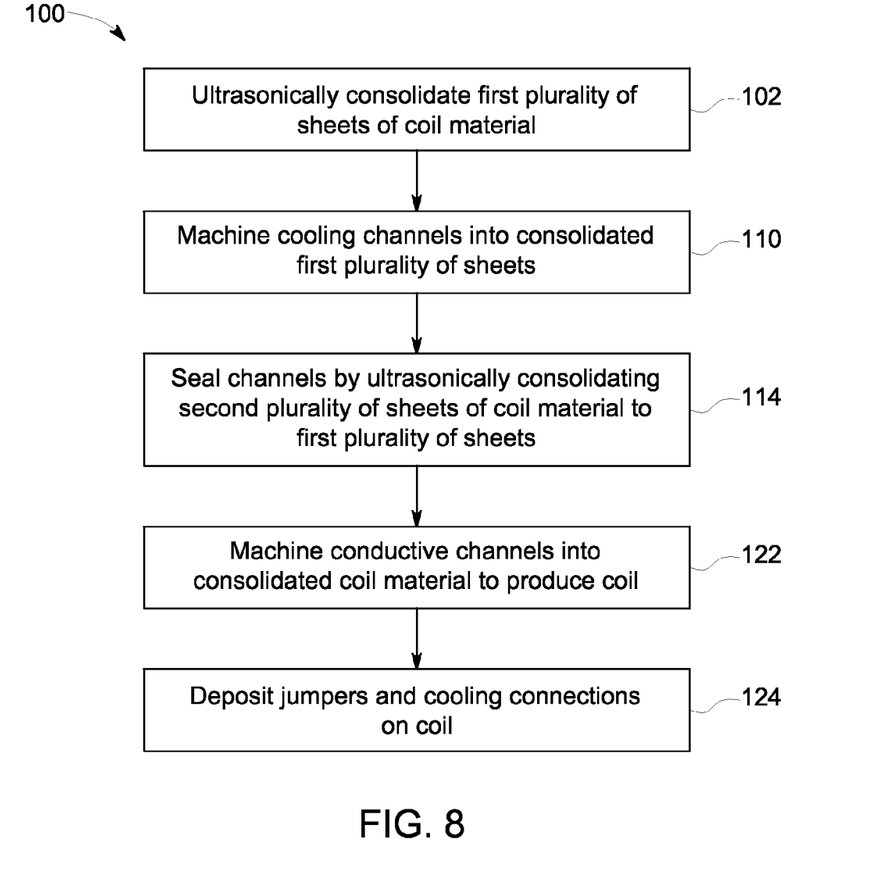
FIG. 8 is a process-flow diagram of an embodiment of a method for manufacturing the MRI gradient coils with cooling channels depicted in FIG. 5.

Referring back to the method 60 in FIG. 2, upon completion of the gradient coil layer 78, a dielectric spacer layer is deposited (block 80). A cross-sectional view of the gradient board 66 including the mandrel 70, the base layer 68, the gradient coil layer 78, the bonding layer 74, and a dielectric spacer layer 82 deposited according to block 80, is illustrated in FIG. 8. As depicted, the dielectric spacer layer 82 may provide additional structural support for the board 66, and may fill voids between portions of the gradient coil layer 78 (e.g., to provide a substantially flat or continuous surface). Furthermore, the dielectric spacer layer 82 may electrically isolate the gradient coils 26, 28, and 30 from external electrical conductors, such as those used to provide current to the gradient coils 26, 28, and 30, except at contact points where electrical current is provided to and from the coils.

Deposition of the dielectric spacer layer 82 may be achieved using any process suitable for depositing dielectric materials. For example, in certain embodiments, the dielectric spacer layer 82 may be deposited using a printer head or a spray process. The dielectric spacer layer 82 may include material having high dielectric (e.g., electrically insulative) properties, such as, but not limited to, a ceramic or a ceramic/epoxy composite, or any other suitable composite materials. Furthermore, the dielectric spacer layer 82 may include a combination of layers made using a dielectric material and the base material. In some embodiments, the dielectric spacer layer 82 may be disposed onto the gradient coil layer 78 prior to deposition of subsequent gradient coil layers 78 to prevent shorting between gradient coil layers.

Following deposition of the dielectric spacer layer 82 according to block 80, the method 60 includes determining (query 84) whether the coil assembly is complete. For example, in embodiments in which the method 60 is automated, the control circuitry of the automated system may determine whether the coil has the predefined geometries, number of conductive and/or insulative layers, or the like. For example, in one embodiment, additional bonding layers 74, gradient coil layers 78, and dielectric spacer layers 82 may be used to complete the gradient coil board 66. Therefore steps 72, 76, and 80 of the method 60 may be repeated until the system determines that the gradient coil assembly is completed. One embodiment of a completed gradient coil assembly 86 having a pre-defined number of gradient coil layers 78, bonding layers 74, and spacer layers 82 is illustrated as a cross-sectional diagram in FIG. 7. It should be noted that the gradient coil assembly 86 may have any number of layers, such as 1, 2, 3, 4, 5, or more bonding, gradient, and/or dielectric spacer layers.

In addition to the layers discussed above, the gradient coil assembly 86 may have resistive shim assemblies and/or passive shim tooling bars deposited and distributed between each of the layers. For example, in certain embodiments, one or more resistive shim assemblies each having one or more resistive shim coils may be interleaved with one or more gradient coil layers according to block 76 of the method 60 (FIG. 2) in a similar manner as described above with respect to the gradient coil layer. Accordingly, after deposition of the dielectric spacer layer 82 (e.g., according to block 80 (FIG. 2)) and the bonding layer 74 (e.g., according to block 72 (FIG. 2)), the resistive shim assemblies having one or more inductors may be deposited. After deposition of the resistive shim assemblies, the acts according to blocks 72, 76, 80, and 84 may be repeated until a predetermined number of gradient coil layers and resistive shim assemblies are incorporated into the gradient coil assembly 86.

In other embodiments, fugitive inks may be deposited inside the bonding layer 74 to form shim pockets. In certain embodiments, the fugitive ink may also be used to form hollow conducting channels within the gradient board. The fugitive ink may be removed via chemical or physical methods (e.g., dissolution, flushing, ejecting, etc.) once the gradient coil assembly 86 is complete, leaving hollow cavities (e.g., shim pockets) within the bonding layer 76. Furthermore, the fugitive ink may be removed by using warm water to dissolve and flush out the fugitive ink from within the bonding layer 74. In other embodiments, an abrasive slurry (e.g., a sand-water mixture) may be passed through at a pressure such that it removes the fugitive ink and smoothes out the shim pockets or any other hollow cavities such as the conducting channels within the gradient coil assembly 86.

Once it is determined, in query 84, that the coil assembly 86 is complete, jumpers and cooling connections may be deposited onto the gradient coil assembly 86 (block 88), though it should be appreciated that such connections may be deposited during deposition of the gradient coil layers 78. It should be noted that prior to deposition of the jumpers and/or cooling connections, a layer of base material (e.g., similar to or the same as the base layer 70) may be deposited. The jumpers, cooling connections, and other similar connectors may be formed using the metal deposition techniques discussed above (e.g., ultrasonic consolidation, laser sintering, laser cladding, electron beam wire deposition). Accordingly, three-dimensional features such as electrical connectors, inlet connectors, and outlet connectors may be deposited onto the gradient coil assembly 86 without soldering and/or brazing the connectors, which may enhance durability.

Because the connectors may be used for coupling to cooling fluid sources, the connectors may include internal fluid paths, which enable the flow of the coolant into cooling channels 90 of the coils. Furthermore, the connectors may have geometries that are more conducive for securing with external cooling and/or electrical sources. For example, the connectors may have smooth and/or rounded edges, smooth threads, or a combination thereof, such that tube fittings may be used to secure the tubing from the cooling source to the connectors. As noted above, upon complete deposition of the jumpers and/or cooling connector (e.g., after all layers of the gradient coil assembly 86 are in place), the gradient coil assembly 86 may be placed in an oven or other suitable heating source to cure any remaining uncured composite material (e.g., former material).

As set forth above with respect to block 76 of FIG. 2, in certain embodiments, ultrasonic consolidation may be utilized to deposit conductive channels for use as gradient coils in the gradient coil assembly 86. FIG. 8 illustrates an embodiment of a method 100 for constructing the gradient coils 26, 28, and 30 using ultrasonic consolidation. In addition, to facilitate discussion of aspects of the method 100, reference is made to corresponding structures resulting from the acts of the method 100 in FIG. 9.

Figure 9:
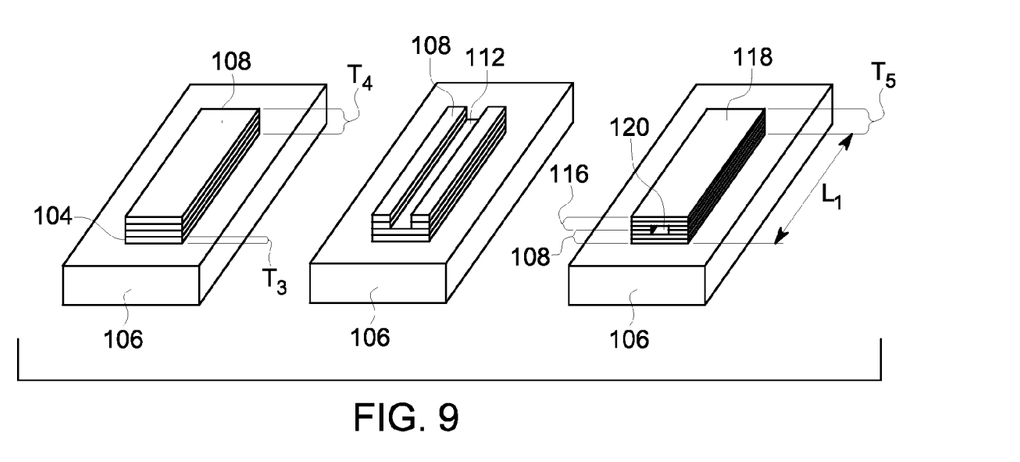
FIG. 9; is a diagrammatical illustration of an embodiment of an MRI gradient coil resulting from various steps of the method of FIG. 8.

The method 100 includes depositing a first plurality of sheets of a conductor material (e.g., the coil material) onto a substrate (e.g., the base layer or the seed layer), and ultrasonically consolidating the first plurality of sheets of the conductor material together to form a structure (block 102). For example, with reference to FIG. 9, the configuration resulting from the acts of block 102 are depicted. Moving from left to right, the diagram in FIG. 9 illustrates a first plurality of metal sheets 104 having a desired thickness $T_3$ deposited onto a substrate 106 (e.g., the bonding layer 74 in FIG. 4), according to the acts of block 102. The thickness $T_3$ of the first plurality of metal sheets 104 may be any suitable size, such as between 0.02 and 0.001 inches, 0.012 and 0.003 inches, 0.009 and 0.005 inches, or approximately 0.006 inches. The metal sheets may include any conductive material suitable for ultrasonic consolidation to produce the gradient coils 26, 28, and 30. By way of example, such materials may include highly conductive metals such as 101 OFHC copper, aluminum, and their respective alloys, among others. By applying a suitable amount of force and ultrasonic vibrations (e.g., a frequency of approximately 20 kHz) to each metal layer, the first plurality of metal sheets 104 are consolidated to form a first consolidated structure 108 having a thickness $T_4$ of approximately 1 to 10 mm.

Returning to the method 100 of FIG. 8, following consolidation of the first plurality of metal sheets, cooling channels are machined into the consolidated structure (block 110). In accordance with block 110, as depicted in the middle structure in FIG. 9, a cavity 112 is machined into the first consolidated structure 108. The cavity 112 may be used to generally define the size (e.g., cross-sectional area) of one or more internal cooling channels formed into the coil resulting from the method 100. Accordingly, the size of the cavity 112 will generally correspond to the size of the cooling channel. While any relative size is presently contemplated, by way of non-limiting example, the thickness of the cavity 112 may be at least approximately 10% of the thickness of the first consolidated structure 108, such as between approximately 10% and 90% of the thickness, between approximately 20% and 80% of the thickness, or between approximately 30% and 60% of the thickness of the first consolidated structure 108.

Returning again to the method 100 of FIG. 8, upon machining in accordance with block 110, the method 100 includes sealing the machined cooling channels by ultrasonically consolidating a second plurality of sheets of the conductor material to the first plurality of sheets of the conductor material (block 114). Referring again to FIG. 9, referring to the structure at the right, a second plurality of metal sheets 116 are consolidated to the first plurality of metal sheets 108 to form a second consolidated structure 118 having a thickness $T_5$ and a cooling channel 120, according to block 114. The second consolidated structure 118 may have a constant or variable cross section and may have a desired length $L_1$ and thickness $T_5$. It should be appreciated that the consolidated structure 118 may have more than one cooling channel 120. The cooling channels may be equal, meaning each channel has the same dimensions, or they may have variable dimensions, where each channel has different dimensions, or a combination thereof.

Returning to FIG. 8, the method 100 also includes machining conductive channels into the sealed consolidated structure to produce a coil (block 122). For example, the machining performed in accordance with block 122 may produce one or more desired coil geometries, such as curves, bends, varying angles and turning radii, and so on.

Before, during, or after forming the desired coil geometries, electrical connectors, jumpers, and cooling fluid connectors may be deposited onto the coil (block 124). For example, using ultrasonic consolidation, one or more connector features may be consolidated to the existing structure, obviating the use of solder, or other similar joint mechanisms.

As also noted above, in certain embodiments, in addition to, or in lieu of using ultrasonic consolidation, the gradient coils 26, 28, and 30 may be deposited using laser powder deposition (LPD) or electron beam melting (EBM). To facilitate discussion of certain aspects of these methods, reference will be made to the structures in FIG. 9. In such methods, a focused laser/electron beam melts, sinters, or otherwise consolidates a portion of the bonding layer 74 such that the conductor material (e.g., in the form of a powder or wire) introduced at the junction between the laser/electron beam and the surface of the bonding layer 74 may be fused onto the surface of the bonding layer 74. Subsequent layers of conductor material are deposited in a similar manner; that is, each layer of the conductor material is fused to a desired portion of the preceding layer to produce a consolidated structure similar to the middle structure seen in FIG. 9. Cooling channels may be incorporated into the consolidated structure by advanced tool path planning or introducing a sacrificial material such as, but not limited to, a fluid (e.g., water), fugitive ink, polymer, and/or metal with low melting point into the cavity 112 prior to deposition of additional layers of the conductive material that seal the cavity 112 to produce the consolidated structure 118. The sacrificial material may be removed via physical and/or chemical processes (e.g., dissolution, flushing, ejecting, etc.) from the consolidated structure 118 resulting in the cooling channel 120. In yet further embodiments, the cavity 112 may be formed by etching the first consolidated structure 108 using the laser/electron beam.

The gradient coils 26, 28, and 30 produced from the methods and techniques described above may have relatively simple geometries (e.g., substantially straight or having relatively simple bends or turns) or more complex geometries (e.g., a plurality of turns having different directions or geometries). For example, in one embodiment, the gradient coils 26, 28, and 30 may have a round cross-sectional geometry. Moreover, as discussed above, the geometry of the cooling channels may be equal or may have variable dimensions, or a combination thereof. Furthermore, the cooling channels may diverge or converge at a turn spacing of the gradient coil assembly 86 so as to enable a desired flow of a cooling fluid through the channels and suitable contact between the cooling fluid and the surface of the gradient coils 26, 28, and 30.

Figure 10:
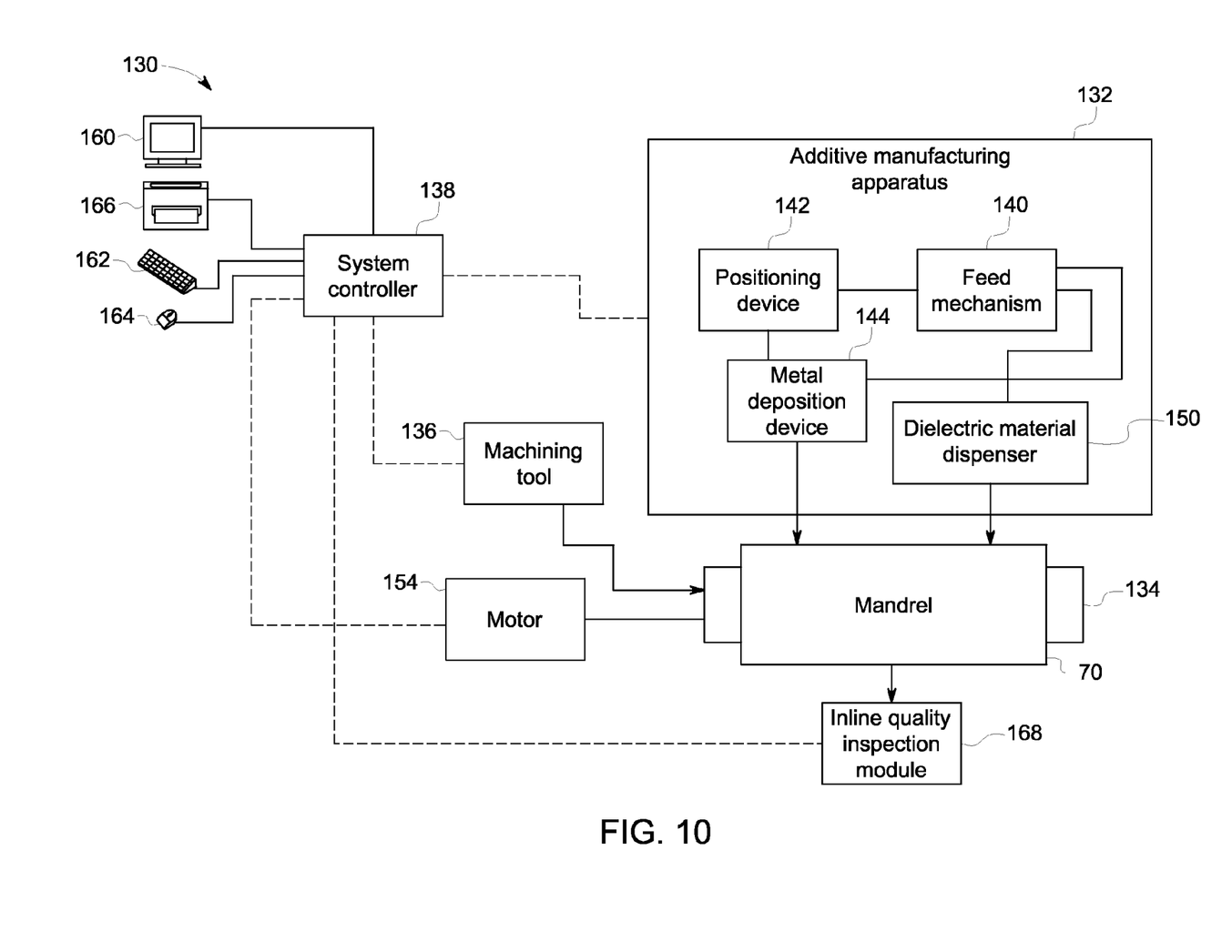
FIG. 10 is a diagrammatical illustration of an embodiment of a system used to manufacture MRI gradient coil assemblies.

As noted above, the embodiments described herein enable the manufacturing of gradient coil assemblies used in MRI systems using additive manufacturing techniques. One system capable of such manufacturing is depicted in FIG. 10. In particular, FIG. 10 is an embodiment of an additive manufacturing system 130 that performs the methods of FIGS. 2 and 8. The additive manufacturing system 130 includes an additive manufacturing apparatus 132, a consolidation platform 134, a machining tool 136, and a system controller 138. The additive manufacturing housing 132 further includes a feed mechanism 140, a positioning device 142, a metal deposition device 144, and a dielectric material dispenser 150. The feed mechanism 140 is configured to supply the positioning device 142, the metal deposition device 144, and/or the dielectric material dispenser 150 with materials used to build the gradient coil assembly, such as the gradient coil assembly 86 depicted in FIG. 7. For example, the feed mechanism 140 may supply an electrically conductive material including, but not limited to, metals such as aluminum, copper and/or their alloys, electrically conductive composite materials, or a combination thereof, to build a consolidated structure to form an inductor. The conductive material may be in the form of a sheet, ribbon, tape, wire, powder, or any combination thereof. In other embodiments, the feed mechanism 140 may supply dielectric materials, such as ceramics and/or ceramic epoxies to the dielectric material dispenser 150 to form a dielectric spacer layer (e.g., dielectric spacer layer 82 of FIG. 7).

The positioning device 142, during operation, positions various materials (e.g., coil material, dielectric spacer material, substrate material) according to information received from the system controller 138. For example, as discussed in further detail below, a coil design may be input via a computer-assisted drawing program and provided to the system controller 138, which may in turn command operation of the system 130 to construct the coil board/assembly according to the predefined geometric specifications. In particular, the system controller 138 may command the operation of the positioning device 142 to move certain features of the additive manufacturing apparatus 132, such as the metal deposition device 144 and/or the dielectric material dispenser 150.

In constructing the gradient coils, for instance, the positioning device 142 may move the metal deposition device 144 (e.g., an ultrasonic consolidation head, a laser, or an electron beam emission device) to a point on a base layer, such as the base layer 68 in FIG. 3, on the mandrel 70 supported by the consolidation platform 134. The metal deposition device 144 may deposit the conductive material, supplied by the feed mechanism 140, onto the base layer 68. The metal deposition device 144 then consolidates the conductive material to, and, along with the machining tool 136, forms the conductive and cooling channels of the gradient coils 26, 28, and 30. As set forth above, in one embodiment, the metal deposition device 144 is an ultrasonic consolidator. The ultrasonic consolidator applies force (e.g., approximately 1000-3000 N) and ultrasonic vibrations (e.g., frequency approximately 20 kHz, amplitude between 10 and 50 µm) to the conductive material to consolidate each layer of the conductive material and form the inductor, such as the consolidated structure 118 depicted in FIG. 9. In other embodiments, the metal deposition device 144 includes a laser emitter or electron beam emitter that melts, sinters, brazes, fuses, or otherwise consolidates each layer of the electrically conductive material to yield the consolidated structure 118 depicted in FIG. 9.

In constructing the coil assemblies, the positioning device 142 may move in concert with the mandrel 70, which may be coupled to a motor 154. The system controller 138 may control the mandrel 70 to cause the mandrel 70 to rotate and translate on the consolidation platform 134, thereby enabling construction of the inductor and cooling channels on a gradient coil board (e.g., gradient board 66 in FIG. 5). Again, the machining tool 136, working in concert with the metal deposition device 144, may machine desired inductor and cooling channel patterns into the consolidated conductive materials. For example, when the metal deposition device 144 consolidates the conductive material, the machining tool 136 may machine the inductor and/or cooling channel patterns according to information received from the system controller 138.

As discussed above with respect to the method 60 of FIG. 2, upon completion of the inductor and cooling channels, the dielectric material dispenser 150 deposits the dielectric spacer layer 82. The dielectric material dispenser 150 receives a dielectric material, such as but not limited to, ceramic, ceramic/epoxy composites, or any other suitable dielectric material, from the feed mechanism 140. The dielectric material dispenser 150 may deposit the dielectric material onto the gradient board using a spray mechanism, or any other suitable dielectric deposition mechanism.

As noted above, predetermined geometries for the various layers of the gradient coil assemblies may be input to the system controller 138, which enables the system controller 138 to in turn command the operation of various features of the additive manufacturing apparatus 132 to construct the desired gradient coil assembly. Accordingly, the additive manufacturing system 130 may also include features that enable a user to interface with the system controller 138 and other devices of the system 130. For example, the system controller 138 may include devices employing a general purpose or an application-specific computer, both of which may include memory circuitry for storing gradient coil parameters such as inductor, cooling channel, connector geometries and patterns, and images (e.g., of a desired conductor configuration). The system controller 138 also may include a computer numerical controller (CNC) for the automated manufacturing of gradient coil boards. The CNC may enable enhanced accuracy, automation, and repeatable construction of inductor and cooling channels (e.g., the same type of inductor and/or cooling channel can be made each time) compared to more traditional construction methods such as hand winding, which in turn improves quality control and the overall efficacy of the gradient boards.

The system controller 138 may include a wide range of devices for facilitating interface between an operator and the additive manufacturing system 130. In the illustrated embodiment, for example, the devices include a monitor 160, a conventional computer keyboard 162, and an alternative input device such as a mouse 164. For example, the system controller 138 may include a computer assisted drawing or modeling program enabling a user to define various coil and layer geometries. A printer 166 may be used to generate hard copy outputs of inductor, cooling channel, and/or connector parameters, geometries, and images of gradient coil board designs.

The system controller 138 may also receive information indicative of the quality of the inductor and cooling channels from an inline quality inspection module 168. For example, the inline quality inspection module 168 may provide information about the conductor, cooling channel, and connector geometries to the control system 138, therefore the control system 138 may compare the received information to specifications ranges stored in the memory circuitry and adjust the gradient coil parameters accordingly. In certain embodiments, the metal deposition device 144 may include integrated inspection sensors, such as optical charge-coupled devices, for monitoring and verification of the additive manufacturing steps. In certain embodiments, the quality inspection module 168 may provide feedback to the system controller 138 indicative of errors in construction. The controller 138 may use the feedback to adjust the operation of one or more features of the additive manufacturing apparatus 132 to meet the predefined specifications for the various geometries (e.g., of the coils, cooling channels, spacer layers) input into the system 130.

This written description uses examples to disclose the invention, including the best mode, and also to enable any person skilled in the art to practice the invention, including making and using any devices or systems and performing any incorporated methods. It should also be understood that the various examples disclosed herein may have features that can be combined with those of other examples or embodiments disclosed herein. That is, the present examples are presented in such a way as to simplify explanation but may also be combined one with another. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A system, comprising:
   an additive manufacturing system comprising a plurality of configurable elements configured to deposit a plurality of materials to form a gradient coil assembly, wherein the configurable elements comprise a feed mechanism configured to supply a dielectric material to a dielectric material dispenser;
   a platform comprising a mandrel configured to support the plurality of materials as they are deposited;
   a computer control system communicatively coupled to the additive manufacturing system, the platform, or a combination thereof, wherein the computer control system is configured to control the additive manufacturing system, the platform, or the combination thereof, such that the system produces an inductor having one or more internal fluid paths, and the inductor having predefined geometric specifications input into the computer control system; and
   a quality inspection module communicatively coupled to the computer control system and configured to provide feedback to the computer control system, wherein the feedback comprises information about the inductor and the computer control system adjusts operation of one or more features of the additive manufacturing system to meet the predefined geometric specifications; wherein the platform rotates and translates to construct the inductor and the one or more internal fluid paths on a gradient board, the inductor comprising conductive and insulative layers.

2. The system of claim 1, wherein the platform is coupled to a motor capable of translating the platform, rotating the platform, or a combination thereof.

3. The system of claim 1, wherein the configurable elements comprise a metal deposition device comprising an ultrasonic consolidation head, a laser beam source, an electron beam source, or a combination thereof, configured to consolidate a conductor material to form the inductor.

4. The system of claim 3, wherein the configurable elements comprise a positioning device coupled to the metal deposition device, and the positioning device is capable of positioning the metal deposition device along the platform.

5. The system of claim 3, wherein the feed mechanism is configured to supply the metal deposition device with a conductor material.

6. The system of claim 3, wherein the configurable elements comprise a machining tool capable of machining patterns into the inductor to produce the one or more internal fluid paths.

7. A system comprising:
   a computer controller configured to operate and to adjust one or more operational parameters of an additive manufacturing system to produce an inductor having predefined geometric specifications input into the computer controller, wherein the one or more operational parameters comprises an operational parameter of a dielectric material dispenser and an operational parameter of an inductor material deposition device of a feed mechanism of the additive manufacturing system to controllably deposit gradient board material on a working surface of the additive manufacturing system; and
   an inline quality inspection module communicatively coupled to the computer controller, wherein the inline quality inspection module is configured to inspect the inductor and provide feedback relating to one or more inductor parameters to the computer controller, wherein the computer controller is configured to receive the one or more inductor parameters and adjust at least one of the one or more operational parameters of the additive manufacturing system based on the received one or more inductor parameters and to meet the predefined geometric specifications;
   wherein the inductor is constructed on a gradient board, the inductor comprising one or more cooling channels formed by the gradient board materials, wherein the gradient board materials comprises a combination of conductive and insulative layers; and wherein the computer controller adjusts rotation and translation of the constructive platform where the inductor is formed to meet the predefined specifications.

8. A system, comprising:
   an additive manufacturing system comprising:
      a deposition device configured to deposit and consolidate a plurality of layers of a conductive material onto a working surface of the additive manufacturing system to generate an inductor of a gradient coil assembly;
      a dispenser configured to deposit one or more layers of an insulative material onto the working surface to generate a portion of the gradient coil assembly; and
      a positioning device coupled to the deposition device, the dispenser, or both, and configured to move the deposition device, the dispenser, or both, to deposit the respective material onto the working surface according to predefined geometric specifications of the gradient coil assembly;
   a constructive platform comprising the working surface, wherein the working surface is a mandrel configured to rotate and translocate;

a machining tool coupled to the additive manufacturing system and configured to machine a geometric pattern into the consolidated plurality of layers of the conductive material to generate one or more cooling channels within the inductor; and a computer controller configured to operate and to adjust one or more parameters of the additive manufacturing system in response to an input associated with a quality of the inductor, the one or more cooling channels, or both, such that the inductor, the one or more cooling channels, or both, accord to the predetermined geometric specifications.

9. The system of claim 8, comprising an inline quality inspection module communicatively coupled to the computer controller, wherein the inline quality inspection module is configured to inspect the inductor, the one or more cooling channels, or both, and to provide the input to the computer controller.

\* \* \* \* \*